US012742637B2

(12) United States Patent
Ohtsuka et al.

(10) Patent No.: US 12,742,637 B2
(45) Date of Patent: Sep. 22, 2026

(54) FILM THICKNESS MEASURING DEVICE AND FILM THICKNESS MEASURING METHOD

(71) Applicant: HAMAMATSU PHOTONICS K.K., Hamamatsu (JP)

(72) Inventors: Kenichi Ohtsuka, Hamamatsu (JP); Kazuya Iguchi, Hamamatsu (JP); Tomonori Nakamura, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 159 days.

(21) Appl. No.: 18/276,393

(22) PCT Filed: Nov. 4, 2021

(86) PCT No.: PCT/JP2021/040612
§ 371 (c)(1),
(2) Date: Aug. 8, 2023

(87) PCT Pub. No.: WO2022/172532
PCT Pub. Date: Aug. 18, 2022

(65) Prior Publication Data

US 2024/0125589 A1 Apr. 18, 2024

(30) Foreign Application Priority Data

Feb. 9, 2021 (JP) ................................ 2021-019160

(51) Int. Cl.
*G01B 11/06* (2006.01)
*H10P 72/00* (2026.01)

(52) U.S. Cl.
CPC ...... *G01B 11/0683* (2013.01); *H10P 72/0421* (2026.01); *H10P 72/0604* (2026.01); *G01B 2210/56* (2013.01)

(58) Field of Classification Search
CPC ........... G01B 11/0625; G01B 11/0683; G01B 2210/56; H01L 21/67069; H01L 21/67253; H01L 22/12
(Continued)

(56) References Cited

U.S. PATENT DOCUMENTS

| | | | |
|---|---|---|---|
| 5,450,205 | A | 9/1995 | Sawin et al. |
| 8,872,059 | B2 | 10/2014 | Park et al. |

(Continued)

FOREIGN PATENT DOCUMENTS

| | | | |
|---|---|---|---|
| CN | 102483320 | A | 5/2012 |
| CN | 102954765 | A | 3/2013 |

(Continued)

OTHER PUBLICATIONS

International Preliminary Report on Patentability mailed Aug. 24, 2023 PCT/JP2021/040612.

(Continued)

*Primary Examiner* — Sunghee Y Gray
(74) *Attorney, Agent, or Firm* — Faegre Drinker Biddle & Reath LLP

(57) ABSTRACT

A film thickness measuring apparatus measures a film thickness of a sample during a manufacturing step. The film thickness measuring apparatus includes a lens focusing light (plasma light) generated in the manufacturing step and reflected by one surface of the sample, an inclined dichroic mirror having a transmissivity and a reflectivity changing in accordance with a wavelength in a predetermined wavelength region and separating light focused by the lens through transmission and reflection, an area sensor capturing an image of light separated by the inclined dichroic mirror, and a control apparatus estimating the film thickness of the sample on the basis of a signal from the area sensor capturing an image of light and obtaining a film thickness (Continued)

distribution on the one surface of the sample. Light reflected by the sample includes light having a wavelength included in the predetermined wavelength region of the inclined dichroic mirror.

14 Claims, 8 Drawing Sheets

(58) Field of Classification Search
USPC .......................................................... 356/630
See application file for complete search history.

(56) References Cited

U.S. PATENT DOCUMENTS

| | | | | |
|---|---|---|---|---|
| 9,847,262 | B2 | 12/2017 | Samara et al. | |
| 2002/0127950 | A1* | 9/2002 | Hirose | B24B 49/04 451/6 |
| 2012/0097864 | A1 | 4/2012 | Takahashi et al. | |
| 2016/0370174 | A1* | 12/2016 | Bonino | G01B 11/0616 |

FOREIGN PATENT DOCUMENTS

| | | | | |
|---|---|---|---|---|
| JP | H11-033901 | A | | 2/1999 |
| JP | 2003-083720 | A | | 3/2003 |
| JP | 2003-329414 | A | | 11/2003 |
| JP | 2004069651 | A | * | 3/2004 |
| JP | 2008-020332 | A | | 1/2008 |
| JP | 2011-027706 | A | | 2/2011 |
| JP | 2017-125782 | A | | 7/2017 |
| JP | 2019-120607 | A | | 7/2019 |
| JP | 2020-136568 | A | | 8/2020 |
| TW | 201930818 | A | | 8/2019 |
| WO | WO-2011/045967 | A1 | | 4/2011 |

OTHER PUBLICATIONS

Vladimir, Samara et al., “In-situ monitoring of etch uniformity using plasma emission interferometry,” Article in Jounal of Vacuum Science & Technology B Microelectronics and Nanometer Structures, Apr. 9, 2015.

* cited by examiner

Fig.6

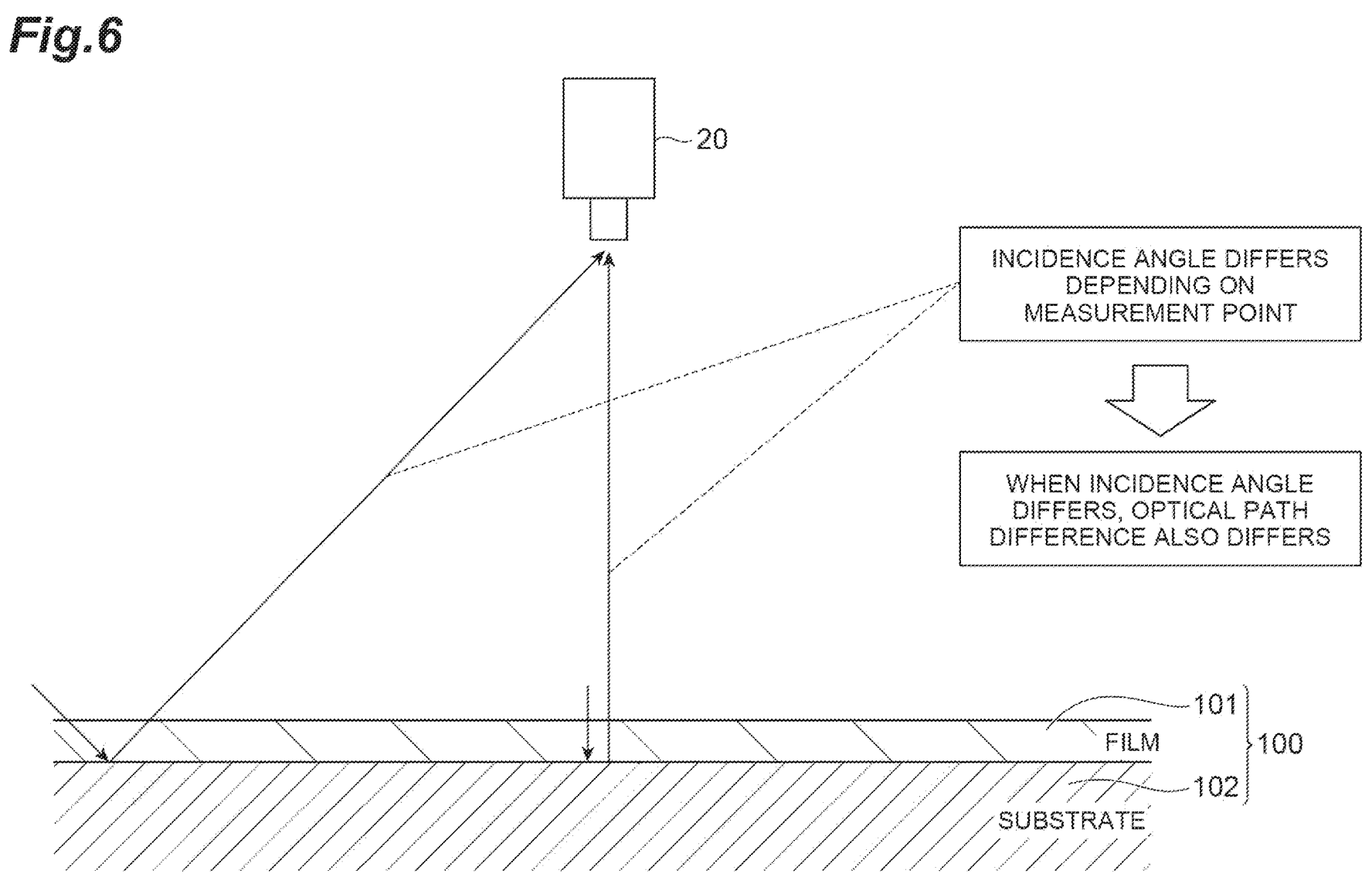

INCIDENCE ANGLE DIFFERS DEPENDING ON MEASUREMENT POINT

WHEN INCIDENCE ANGLE DIFFERS, OPTICAL PATH DIFFERENCE ALSO DIFFERS

20

100

101

102

FILM

SUBSTRATE (a)

(b)

FILM THICKNESS MEASURING DEVICE AND FILM THICKNESS MEASURING METHOD

TECHNICAL FIELD

An aspect of the present invention relates to a film thickness measuring apparatus and a film thickness measuring method.

BACKGROUND ART

In a step of manufacturing a semiconductor device, there is a step of forming a thin film having a predetermined film thickness on a wafer, such as film formation and etching. Regarding an apparatus for measuring a film thickness of a semiconductor device, an apparatus for measuring a film thickness by irradiating a semiconductor device with light from a light source and detecting light from the semiconductor device is known (for example, refer to Patent Literature 1 to Patent Literature 3).

In addition, regarding an apparatus for measuring a film thickness of a semiconductor device, an apparatus for measuring a film thickness of a thin film during film formation or etching by detecting light reflected by a semiconductor device during manufacturing using luminescence (for example, plasma light) generated inside an apparatus for manufacturing a semiconductor device as illumination light is known (for example, refer to Patent Literature 4, Patent Literature 5, and Non-Patent Literature 1).

CITATION LIST

Patent Literature

[Patent Literature 1] Specification of U.S. Pat. No. 8,872,059

[Patent Literature 2] Japanese Unexamined Patent Publication No. 2019-120607

[Patent Literature 3] PCT International Publication No. WO2011/045967

[Patent Literature 4] Specification of U.S. Pat. No. 5,450,205

[Patent Literature 5] Specification of U.S. Pat. No. 9,847,262

NON-PATENT LITERATURE

[Non-Patent Literature 1] Vladimir Samara, Jean-Francois de Marneffe, Ziad el Otell, Demetre J. Economou. In-situ monitoring of etch uniformity using plasma emission interferometry. Article in Journal of Vacuum Science & Technology B Microelectronics and Nanometer Structures April 2015.

SUMMARY OF INVENTION

Technical Problem

In an apparatus for measuring a film thickness utilizing plasma light as described above, a film thickness is measured by selecting a single or a plurality of wavelengths through filter work, for example, and acquiring light intensity information. In such an apparatus, there is a problem that measurement accuracy fluctuates (measurement accuracy is not uniform) due to fluctuation in intensity of plasma light.

The present invention has been made in consideration of the foregoing circumstances, and an objective thereof is to provide a film thickness measuring apparatus and a film thickness measuring method capable of measuring a film thickness of an object with high accuracy during a manufacturing step.

Solution to Problem

According to an aspect of the present invention, there is provided a film thickness measuring apparatus for measuring a film thickness of an object during a manufacturing step. The film thickness measuring apparatus includes a light focusing element focusing light generated in the manufacturing step and reflected by at least a part on one surface of the object, an optical element having a transmissivity and a reflectivity changing in accordance with a wavelength in a predetermined wavelength region and separating light focused by the light focusing element through transmission and reflection, an image capturing portion capturing an image of light separated by the optical element, and an analysis portion estimating the film thickness of the object on the basis of a signal from the image capturing portion capturing an image of light and obtaining a film thickness distribution of at least a part on the one surface of the object. Light reflected by the object includes light having a wavelength included in the predetermined wavelength region of the optical element.

In the film thickness measuring apparatus according to the aspect of the present invention, light generated in the manufacturing step and reflected by at least a part on the one surface of the object is separated by the optical element having a transmissivity and a reflectivity changing in accordance with a wavelength, an image of separated light is captured by the image capturing portion, the film thickness of the object is estimated based on a signal from the image capturing portion, and the film thickness distribution of at least a part on the one surface of the object is obtained. In such a film thickness measuring apparatus, first, since the film thickness is estimated utilizing light generated in the manufacturing step, there is no need to provide a light source for measuring the film thickness so that a constitution thereof can be simplified. In addition, in this film thickness measuring apparatus, since a proportion of transmitted light and a proportion of reflected light in light separated by the optical element change in accordance with the wavelength, the proportion of transmitted light and the proportion of reflected light can be identified on the basis of a result of a captured image of the image capturing portion. As a result, the wavelength can be identified. Moreover, in the analysis portion, the film thickness of the object is estimated based on a signal from the image capturing portion, and the film thickness distribution can be obtained. Although the film thickness can be estimated on the basis of information indicating the wavelength, since the wavelength is identified from the result of a captured image of the image capturing portion as described above, the film thickness of the object can be estimated with high accuracy in consideration of a signal including information of the wavelength (a signal from the image capturing portion). Since such a technique of measuring a film thickness differs from a method for selecting a single or a plurality of wavelengths through filter work or the like, for example, and acquiring light intensity information and accuracy in measuring a film thickness is unlikely to be affected by fluctuation in intensity of light, accuracy in measuring a film thickness can be maintained at a certain level or higher at all times regardless of the fluctuation in intensity of light generated in the manufacturing step. As above, according to the film thickness measuring apparatus according to the aspect of the present invention, the film thickness of the object during the manufacturing step can be measured with high accuracy.

The image capturing portion may be a two-dimensional image capturing element having a plurality of pixels. The analysis portion may estimate a film thickness corresponding to each pixel on the basis of wavelength information for each of the plurality of pixels in the two-dimensional image capturing element. According to such a constitution, the film thickness distribution on an irradiation surface of an object can be estimated more specifically (for each pixel).

The analysis portion may estimate a film thickness in further consideration of a light focusing angle of light reflected by the object in the light focusing element. Since an optical path changes when the light focusing angle in the light focusing element changes, the film thickness may not be able to be estimated with high accuracy from information of only the wavelength. In this regard, in further consideration of the light focusing angle in the light focusing element, the film thickness can be estimated with higher accuracy in accordance with an actual optical path.

The foregoing film thickness measuring apparatus may further include a bandpass filter disposed between the optical element and the image capturing portion. Accordingly, light beyond a desired wavelength range can be removed so that accuracy in estimating a film thickness can be improved.

The film thickness distribution may be a distribution of a relative film thickness in at least a part on the one surface of the object. In addition, the film thickness distribution may be a distribution of a rate of change of the film thickness over time in at least a part on the one surface of the object. Moreover, the film thickness distribution may be a distribution of an absolute film thickness in at least a part on the one surface of the object. In any film thickness distribution, since information related to the film thickness of the object during the manufacturing step can be obtained as a distribution, accuracy in forming a film thickness can be improved.

The foregoing measuring apparatus may further include a spectroscope measuring an optical spectrum of light reflected by one arbitrary point on the one surface of the object in light focused by the light focusing element. The analysis portion may identify an absolute value of the film thickness at the one point based on the optical spectrum and obtain a distribution of an absolute film thickness in at least a part on the one surface of the object as the film thickness distribution on the basis of a signal from the image capturing portion and the absolute value of the film thickness at the one point. In this manner, since the optical spectrum of light at the one point is measured and the absolute value of the film thickness at the one point is identified, the absolute value can also be estimated with high accuracy for the film thickness in each region other than the one point in the object on the basis of a signal from the image capturing portion and the absolute value of the film thickness at the one point. Accordingly, not only the amount of change in relative film thickness but also the absolute value of the film thickness in each region of the object can be estimated with high accuracy.

According to another aspect of the present invention, there is provided a semiconductor device manufacturing apparatus including a film forming apparatus for forming a film on one surface of an object, and the film thickness measuring apparatus described above. According to such a semiconductor device manufacturing apparatus, the film thickness can be measured while a film is formed on the object so that accuracy in forming a film thickness can be improved by reflecting the result of measurement of the film thickness in formation of the film thickness.

The light focusing element of the film thickness measuring apparatus may be disposed in a manner of facing the one surface of the object inside the film forming apparatus. According to such a constitution, processing of measuring the film thickness can be favorably performed while a film is formed on the object.

The film forming apparatus may perform etching of the film on the one surface of the object. According to such a constitution, the film thickness can be measured while etching of the film is performed on the one surface of the object so that etching accuracy can be improved by reflecting the result of measurement of the film thickness in etching processing.

The film forming apparatus may form a film on the one surface of the object. According to such a constitution, the film thickness can be measured while a film is formed on the one surface of the object so that accuracy in forming a film can be improved by reflecting the result of measurement of the film thickness in processing of film formation.

According to another aspect of the present invention, there is provided a film thickness measuring method for measuring a film thickness of an object during a manufacturing step. The film thickness measuring method includes a first step of focusing light generated in the manufacturing step and reflected by at least a part on one surface of the object; a second step of capturing an image of light separated by an optical element having a transmissivity and a reflectivity changing in accordance with a wavelength in a predetermined wavelength region and separating light focused in the first step through transmission and reflection; and a third step of deriving a wavelength on the basis of a result of a captured image in the second step, estimating the film thickness of the object on the basis of the wavelength, and obtaining a film thickness distribution of at least a part on the one surface of the object. According to the film thickness measuring method according to the aspect of the present invention, accuracy in measuring a film thickness can be maintained at a certain level or higher at all times regardless of the fluctuation in intensity of light generated in the manufacturing step so that the film thickness of the object during the manufacturing step can be measured with high accuracy.

The foregoing film thickness measuring method may further include a fourth step of measuring an optical spectrum of light reflected by one arbitrary point on the one surface of the object in light focused in the first step. In the third step, an absolute value of the film thickness at the one point may be identified based on the optical spectrum, and a distribution of an absolute film thickness in at least a part on the one surface of the object may be obtained as the film thickness distribution on the basis of the result of a captured image and the absolute value of the film thickness at the one point. According to such a film thickness measuring method, the absolute value can also be estimated with high accuracy for the film thickness in each region other than the one point in the object on the basis of a signal from the image capturing portion and the absolute value of the film thickness at the one point. Accordingly, not only the amount of change in relative film thickness but also the absolute value of the film thickness in each region of the object can be estimated with high accuracy.

Advantageous Effects of Invention

According to the present invention, a film thickness can be measured with high accuracy.

BRIEF DESCRIPTION OF DRAWINGS

FIG. 6 is an explanatory view of a difference in an incidence angle of light with respect to a camera system.

DESCRIPTION OF EMBODIMENT

Hereinafter, an embodiment of the present invention will be described in detail with reference to the drawings. In each of the diagrams, the same reference signs are applied to parts which are the same or corresponding, and duplicate description thereof will be omitted.

Figure 1:
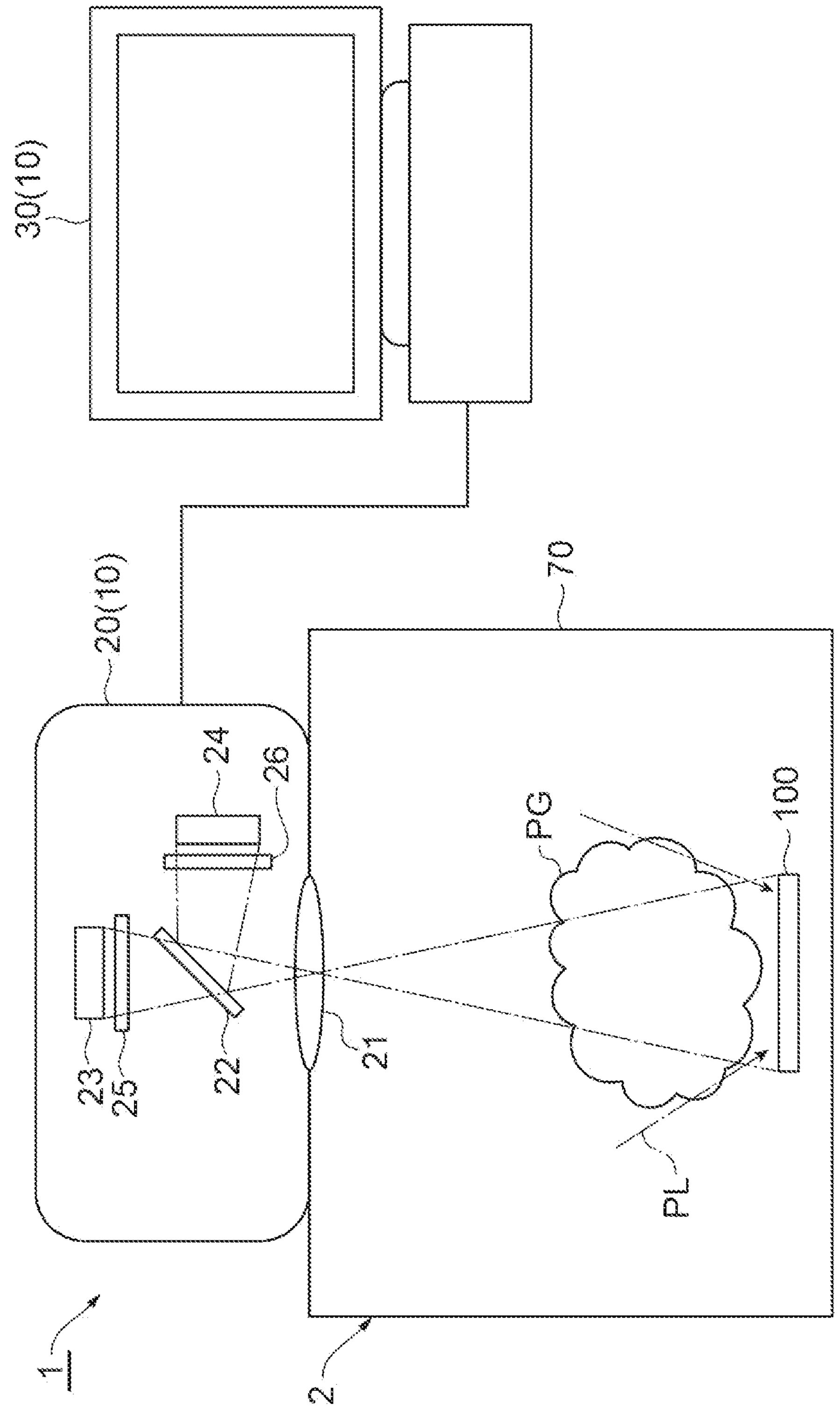
FIG. 1 is a view schematically illustrating a semiconductor device manufacturing apparatus according to an embodiment of the present invention.

FIG. 1 is a view schematically illustrating a semiconductor device manufacturing apparatus 1 according to the present embodiment. A step of manufacturing a semiconductor device includes a preceding step and a following step (assembly step). In the preceding step, after a transistor layer is formed on a wafer, semiconductors are manufactured by forming a plurality of wiring circuit layers on the transistor layer in an overlapping manner. In formation of each of a transistor layer and wiring circuit layers, processings including film formation processing of forming a film on one surface of an object, pattern transfer processing, and etching processing of etching the film on the one surface of the object are individually performed. In the following step, various kinds of product inspection are performed with respect to chips which have been cut out from the wafer and subjected to packaging, and therefore final products are completed. The semiconductor device manufacturing apparatus 1 described in the present embodiment is an apparatus related to at least any one of the film formation processing and the etching processing in the step of manufacturing a semiconductor device described above. Hereinafter, the semiconductor device manufacturing apparatus 1 will be described as an apparatus related to etching processing. The semiconductor device manufacturing apparatus 1 includes a film forming apparatus 2 and a film thickness measuring apparatus 10.

The film forming apparatus 2 is an apparatus for forming a film on one surface of a sample 100 that is an object. Namely, one surface of the sample 100 that is an object indicates a surface having a film formed thereon by film formation, etching, or the like on a semiconductor wafer. In the present embodiment, the film forming apparatus 2 is an etching apparatus for machining a shape of a thin film on the one surface of the sample 100. Specifically, the film forming apparatus 2 is an apparatus for performing etching such as dry etching on a surface of a semiconductor wafer that is the sample 100. Dry etching is an etching method utilizing high-vacuum plasma and is excellent in fine machining and anisotropy. In dry etching, a gas becomes plasmatic inside a vacuum container, and the film on the one surface of the sample 100 is scraped and removed by chemical reaction and accelerated ions. For example, the film forming apparatus 2 performs dry etching by a plasma method such as a microwave electron cyclotron resonance (ECR) plasma method, a capacitively coupled plasma method (CCP), or an inductively coupled plasma method (ICP). In FIG. 1, illustration of various constitutions (a high-frequency power source, a coil, and the like) related to dry etching of the film forming apparatus 2 is omitted.

The film forming apparatus 2 has a chamber 70 that is a vacuum container and performs dry etching by the plasma method with respect to the sample 100 placed inside the chamber 70. When such dry etching is performed, a process gas PG becomes plasmatic inside the chamber 70, and plasma light PL is generated. In the semiconductor device manufacturing apparatus 1 according to the present embodiment, reflected light of such plasma light PL on the one surface of the sample 100 (a surface having a film formed thereon) is detected by the film thickness measuring apparatus 10, and a film thickness is measured on the basis of the reflected light (details will be described below). For example, the sample 100 is various kinds of semiconductor devices such as light emitting elements including LEDs, mini LEDs, micro-LEDs, SLD elements, laser elements, vertical cavity surface emitting laser elements (VCSEL), and OLEDs; light receiving elements; memory elements; and integrated circuits.

The film thickness measuring apparatus 10 is an apparatus for measuring the film thickness on the one surface of the sample 100 during the manufacturing step (here, during dry etching). Namely, the film thickness measuring apparatus 10 is an apparatus for measuring the film thickness on the one surface of the sample 100 having a film formed thereon by a film formation step, an etching step, or the like. A result of measurement of the film thickness by the film thickness measuring apparatus 10 is reflected in the etching processing by the film forming apparatus 2. As illustrated in FIG. 1, the film thickness measuring apparatus 10 includes a camera system 20 and a control apparatus 30 (analysis portion).

The camera system 20 is constituted to include a lens 21 (light focusing element), an inclined dichroic mirror 22 (optical element), area sensors 23 and 24 (image capturing portions), and bandpass filters 25 and 26.

The lens 21 is a light focusing element for focusing light which has been generated in the manufacturing step and reflected by the one surface of the sample 100. The lens 21 is disposed in a preceding stage (upstream) of the inclined dichroic mirror 22. The lens 21 is disposed in a manner of facing the one surface of the sample 100. The lens 21 may be a finite focus lens or may be an afocal lens. When the lens 21 is a finite focus lens, a distance from the lens 21 to the area sensors 23 and 24 is set to have a predetermined value. When the lens 21 is an afocal lens, the lens 21 is a collimator lens for converting light from the sample 100 into parallel light and is subjected to aberration correction such that parallel light is obtained. Light output from the lens 21 is incident on the inclined dichroic mirror 22. Light reflected by the entire surface or a part of the one surface of the sample 100 can be guided to the inclined dichroic mirror 22 by the lens 21.

The inclined dichroic mirror 22 is a mirror prepared using a special optical element and is an optical element separating light which is from the sample 100 and focused by the lens 21 through transmission and reflection in accordance with a wavelength. The inclined dichroic mirror 22 is constituted such that a transmissivity and a reflectivity of light change in accordance with the wavelength in a predetermined wavelength region.

Figure 2:
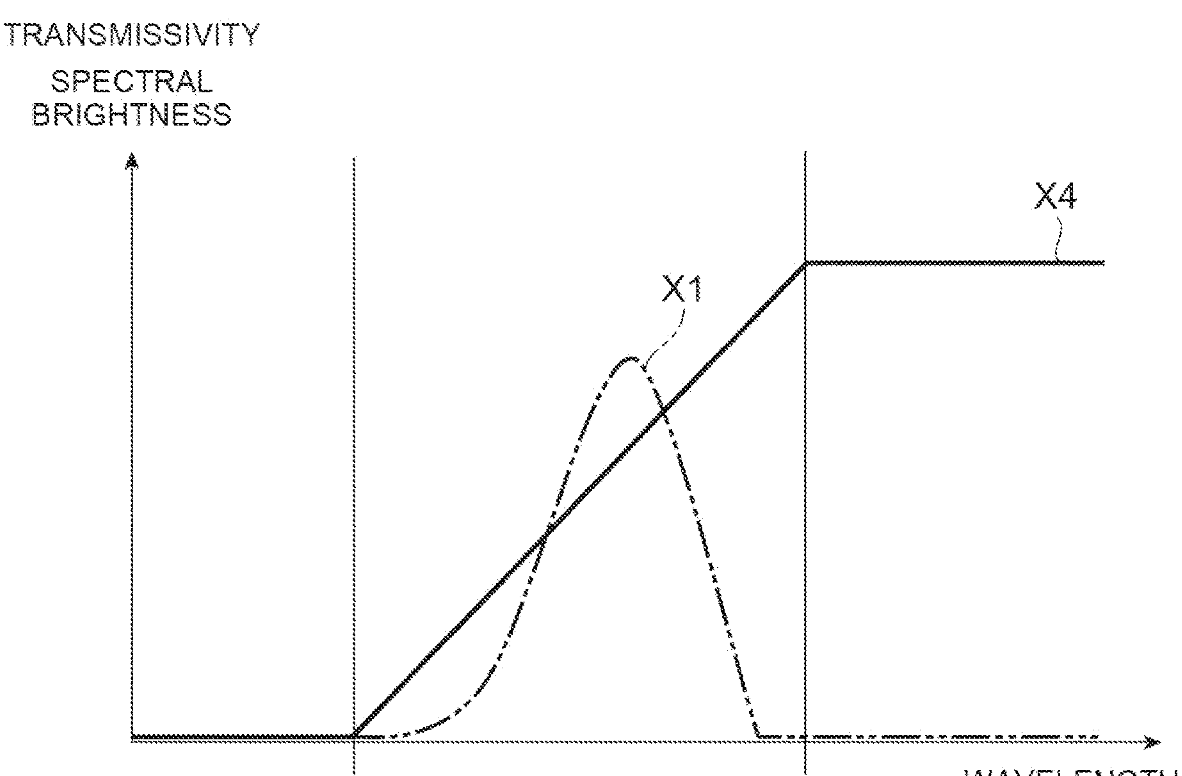
FIG. 2 is an explanatory view of characteristics of a spectrum of light and an inclined dichroic mirror.

FIG. 2 is an explanatory view of characteristics of a spectrum of light and the inclined dichroic mirror 22. In FIG. 2 the horizontal axis indicates the wavelength, and the vertical axis indicates the spectral intensity (in the case of the spectrum of light) and the transmissivity (in the case of the inclined dichroic mirror 22). As indicated by a characteristic X4 of the inclined dichroic mirror 22 in FIG. 2, in the inclined dichroic mirror 22, the transmissivity (and the reflectivity) of light gently change in accordance with a change in wavelength in predetermined wavelength regions (wavelength regions of the wavelengths λ1 to λ2), and the transmissivity (and the reflectivity) of light are uniform regardless of change in wavelength in wavelength regions other than the predetermined wavelength regions (that is, a wavelength side lower than the wavelength λ1 and a wavelength side higher than the wavelength λ2). In other words, the transmissivity of light changes by monotonic increase (the reflectivity monotonically decreases) in accordance with a change in wavelength in particular wavelength bands (wavelength bands of the wavelengths λ1 to λ2). The transmissivity and the reflectivity have a negative correlation in which the other changes in a direction of decrease when one changes in a direction of increase. Therefore, hereinafter, they may be simply described as "a transmissivity" instead of "a transmissivity (and a reflectivity). The expression "the transmissivity of light is uniform regardless of change in wavelength" includes not only a case of being completely uniform but also a case where change in transmissivity is 0.1% or less with respect to a change in wavelength of 1 nm, for example. The transmissivity of light is approximately 0% on a wavelength side lower than the wavelength λ1 regardless of change in wavelength, and the transmissivity of light is approximately 100% on a wavelength side higher than the wavelength λ2 regardless of change in wavelength. The expression "the transmissivity of light is approximately 0%" includes the transmissivity of approximately 0%+10%, and the expression "the transmissivity of light is approximately 100%" includes the transmissivity of approximately 100%-10%. In FIG. 2, a waveform X1 indicates a waveform of light reflected by the sample 100. As indicated by the waveform X1 in FIG. 2, light reflected by the sample 100 includes light having a wavelength included in the predetermined wavelength regions (wavelength regions of the wavelengths λ1 to λ2) of the inclined dichroic mirror 22.

Returning to FIG. 1, the area sensors 23 and 24 are two-dimensional image capturing elements capturing an image of light separated by the inclined dichroic mirror 22. Specifically, the area sensor 23 captures an image of transmitted light in the inclined dichroic mirror 22. The area sensor 24 captures an image of reflected light in the inclined dichroic mirror 22. Wavelength ranges in which the area sensors 23 and 24 are sensitive correspond to the predetermined wavelength regions in which the transmissivity (and the reflectivity) of light change in accordance with a change in wavelength in the inclined dichroic mirror 22. For example, the area sensors 23 and 24 are CCD image sensors or CMOS image sensor (monochrome or color). A result of image capturing (image) performed by the area sensors 23 and 24 is output to the control apparatus 30.

The bandpass filter 25 is disposed between the inclined dichroic mirror 22 and the area sensor 23. The bandpass filter 26 is disposed between the inclined dichroic mirror 22 and the area sensor 24. For example, the bandpass filters 25 and 26 may be filters removing light in wavelength regions other than the predetermined wavelength regions described above (wavelength regions in which the transmissivity and the reflectivity of light change in accordance with the wavelength in the inclined dichroic mirror 22).

The control apparatus 30 is a computer and is constituted to physically include a memory such as a RANI or a ROM, a processor (computation circuit) such as CPU, a communication interface, and a storage portion such as a hard disk. The control apparatus 30 functions by causing the CPU of the computer system to execute a program stored in the memory. The control apparatus 30 may be constituted by a microcomputer or an FPGA.

The control apparatus 30 estimates a film thickness of the sample 100 on the basis of a signal from the area sensors 23 and 24 capturing an image of light. The control apparatus 30 estimates a film thickness at a spot corresponding to each pixel on the basis of wavelength information for each pixel in the area sensors 23 and 24. In more details, the control apparatus 30 derives a wavelength centroid of light for each pixel on the basis of an amount of transmitted light identified based on a result of a captured image (a signal from the area sensor 23) in the area sensor 23, an amount of reflected light identified based on a result of a captured image (a signal from the area sensor 24) in the area sensor 24, a central wavelength of the inclined dichroic mirror 22 (a central wavelength in a predetermined wavelength region), and a width of the inclined dichroic mirror 22 and estimates a relative film thickness that is an amount of change in film thickness at a spot corresponding to each pixel on the basis of the wavelength centroid. For example, the width of the inclined dichroic mirror 22 is a wavelength width from a wavelength in which the transmissivity becomes 0% to a wavelength in which the transmissivity becomes 100% in the inclined dichroic mirror 22. Therefore, a distribution of the relative film thickness on the entire surface or a part of the one surface of the sample 100 can be obtained as a film thickness distribution by focusing light reflected by the entire surface or a part of the one surface of the sample 100 using the lens 21 and capturing an image thereof via the inclined dichroic mirror 22 using the area sensors 23 and 24. In addition, since this relative film thickness can be obtained for each pixel, an etching rate for each pixel can be obtained by obtaining an amount of change in relative film thickness during a predetermined time. Namely, the control apparatus 30 can obtain the etching rate at a spot corresponding to each pixel in etching and can obtain a distribution of the etching rate on the entire surface or a part of the one surface of the sample 100 as a film thickness distribution by deriving the amount of change in relative film thickness at a spot corresponding to each pixel during a predetermined time. Moreover, when the absolute value of the film thickness (absolute film thickness) at a certain point of time is known, a distribution of the absolute film thickness on the entire surface or a part of the one surface of the sample 100 can be obtained as a film thickness distribution by obtaining the relative film thickness from this point of time for each pixel. When the relative film thickness, the etching rate, or the film thickness distribution that is a distribution of the relative film thickness, which has been derived in this manner, is reflected in the etching processing performed by the film forming apparatus 2, etching accuracy can be improved.

Specifically, the control apparatus 30 derives the wavelength centroid of each pixel on the basis of the following Expression (1). In the following Expression (1), λ indicates the wavelength centroid, AO indicates the central wavelength of the inclined dichroic mirror 22, A indicates the width of the inclined dichroic mirror 22, R indicates the amount of reflected light, and T indicates the amount of transmitted light.

$$\lambda=\lambda 0+A(T-R)/2(T+R) \quad (1)$$

Figure 3:
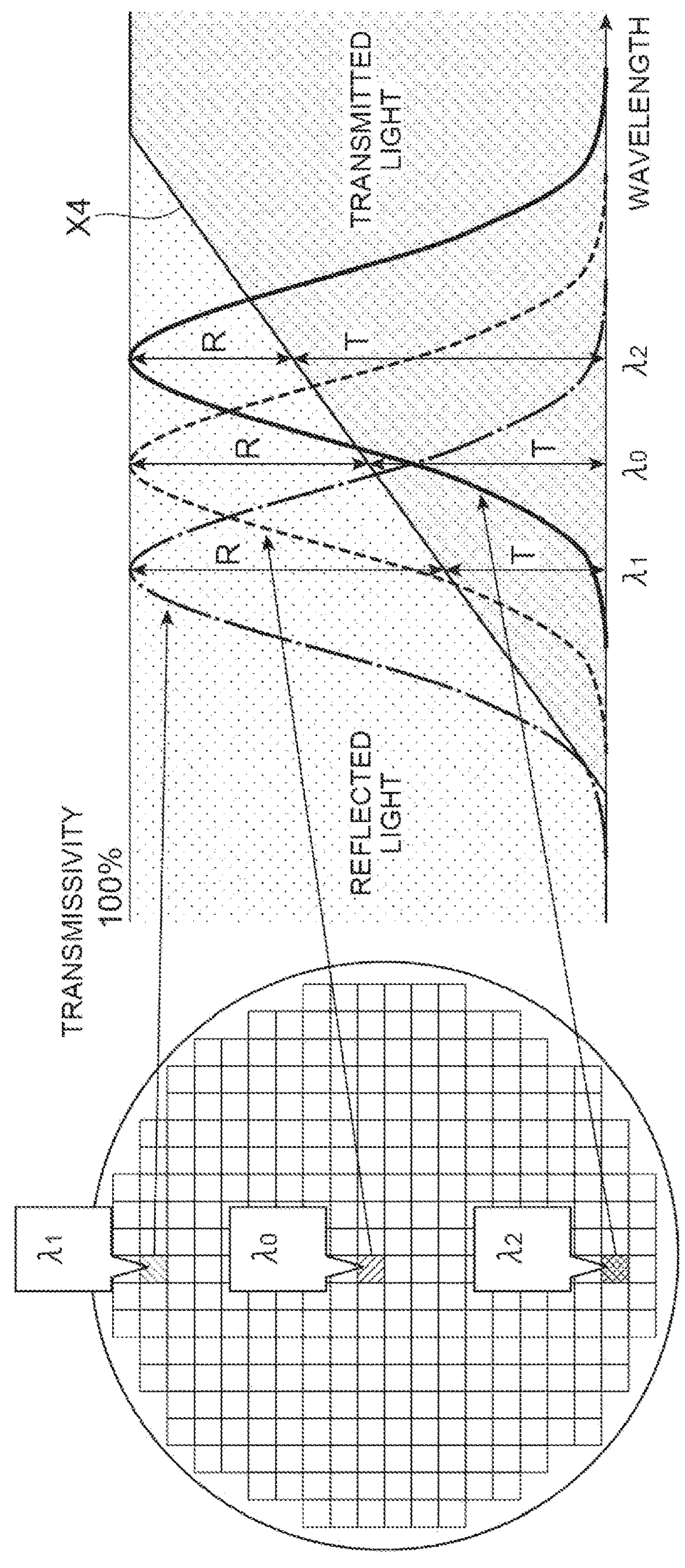
FIG. 3 is an explanatory view of a wavelength shift corresponding to an amount of transmitted light and an amount of reflected light.

FIG. 3 is an explanatory view of a wavelength shift corresponding to an amount of transmitted light and an amount of reflected light. When λ (wavelength centroid) is derived using Expression (1) described above, as illustrated in FIG. 3, regarding a pixel with T (the amount of transmitted light)=R (the amount of reflected light), λ=λ0 (the central wavelength of the inclined dichroic mirror 22) is established. In addition, regarding a pixel with T<R, that is, regarding a pixel with the amount of reflected light larger than the amount of transmitted light, λ=λ1 (a wavelength on a shorter wavelength side than λ0) is established. In addition, regarding a pixel with T>R, that is, regarding a pixel with the amount of transmitted light larger than the amount of reflected light, λ=λ2 (a wavelength on a longer wavelength side than λ0) is established. In this manner, the value of λ (wavelength centroid) shifts (wavelength shift) on the basis of the amount of transmitted light and the amount of reflected light.

A method for deriving a wavelength centroid is not limited to that described above. For example, since λ (wavelength centroid) has a proportional relationship with the following x, the wavelength centroid may be derived from the following Expressions (2) and (3). In the following Expression (3), IT indicates the amount of transmitted light, and IR indicates the amount of reflected light. In addition, when a spectral shape of a measurement object or line formation of the inclined dichroic mirror 22 is an ideal shape, a and b (parameters in Expression (2)) can be determined depending on optical characteristics of the inclined dichroic mirror 22.

$$\lambda=ax+b \quad (2)$$

$$x=IT-IR/2(IT+IR) \quad (3)$$

Actually, since there is a difference (individual difference) in spectral characteristics between optical systems or cameras, x may be derived by the following Expression (4) with reference to a signal intensity of a substrate having known reflection characteristics (for example, intensity information in an initial stage (Time=0)), for example, for the purpose of correcting these. In the following Expression (4), ITr indicates the amount of transmitted light in the reference, and IRr indicates the amount of reflected light in the reference.

$$x=(IT/ITr-IR/IRr)/2(IT/ITr+IR/IRr) \quad (4)$$

In addition, x may be derived by the following Expression (5) using an amount of signal in a non-reflective state for the purpose of eliminating an influence of direct light from plasma. In the following Expression (5), ITb indicates the amount of transmitted light in the non-reflective state, and IRb indicates the amount of reflected light in the non-reflective state.

$$x=\{(IT-ITb)/(ITr-ITb)-(IR-IRb)/(IRr-IRb)\}/2\{(IT-ITb)/(ITr-ITb)+(IR-IRb)/(IRr-IRb)\} \quad (5)$$

In addition, in order to comprehensively perform various kinds of correction for film characteristics, a plasma spectrum, non-linearity of the inclined dichroic mirror 22, and the like, the wavelength centroid (λ) may be approximated by a polynomial expression such as the following Expression (6). Each of the parameters (a, b, c, d, and e) in the following Expression (6) is determined by measuring a plurality of samples having different wavelength centroids (film thicknesses), for example.

$$\lambda=ax4+bx3+cx2+dx+e \quad (6)$$

Figure 4:
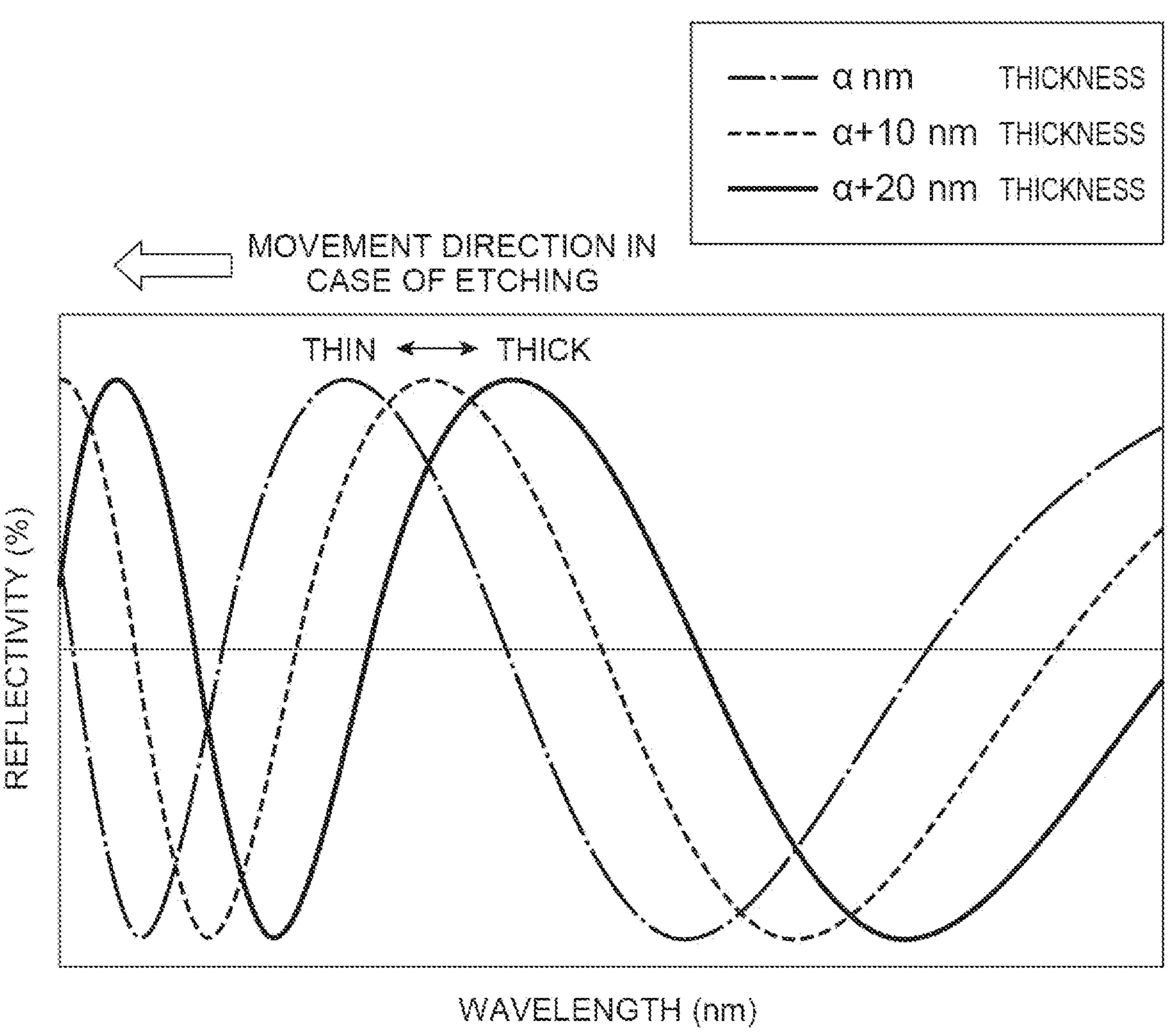
FIG. 4 is an explanatory view of a principle of measurement of a film thickness.

FIG. 4 is an explanatory view of a principle of measurement of a film thickness. In FIG. 4, the horizontal axis indicates the wavelength, and the vertical axis indicates the reflectivity. In the example illustrated in FIG. 4, a relationship between the wavelength and the reflectivity for each of an example in which the film thickness is a nm, an example of π+10 nm, and an example of α+20 nm is illustrated. As illustrated in FIG. 4, the wavelength centroid differs due to the difference in film thickness. For this reason, the film thickness can be estimated by identifying the wavelength centroid. Further, an etching rate in the etching processing can be derived, for example, by deriving the amount of change in film thickness during a predetermined time. As illustrated in FIG. 4, since the film thickness is reduced as etching progresses, it changes from the graph on the right side in the diagram to the graph on the left side in the diagram as etching progresses.

Figure 5:
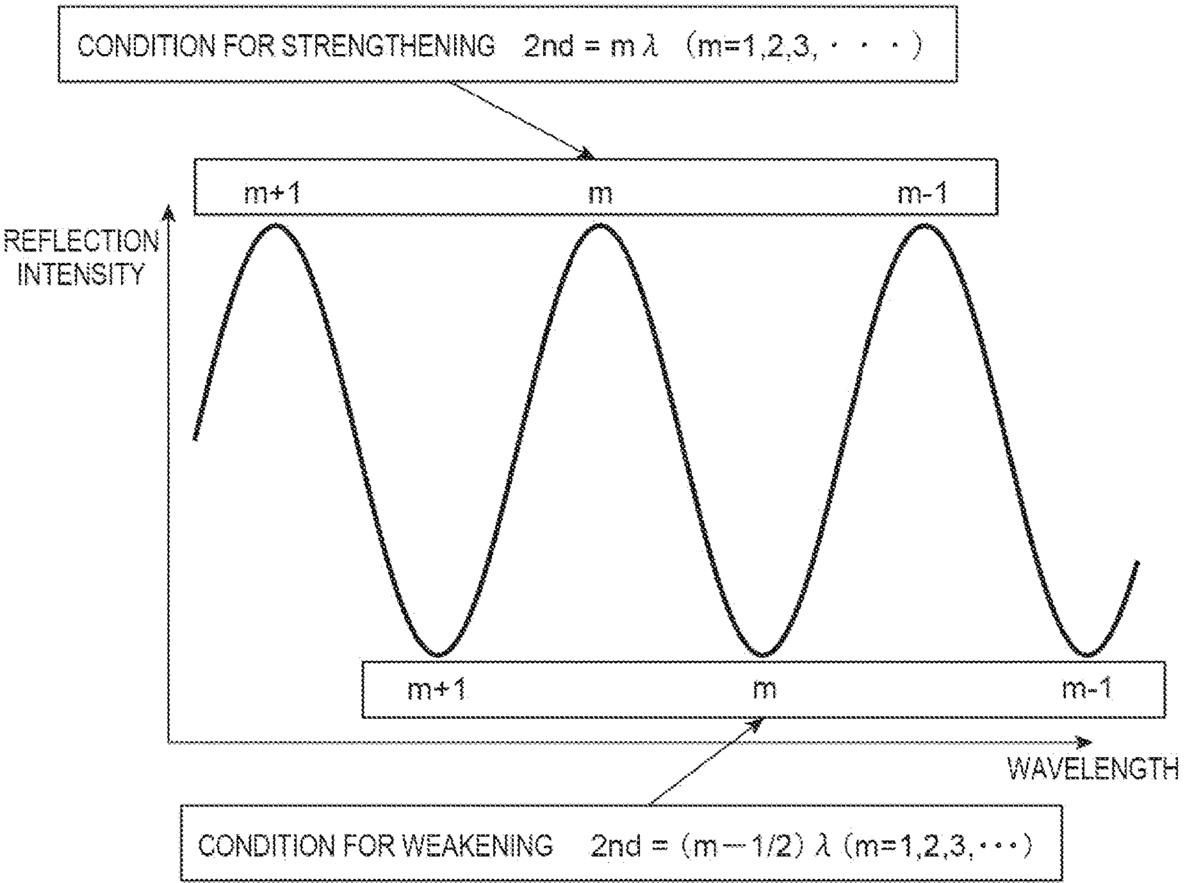
FIG. 5 is another explanatory view of the principle of measurement of a film thickness.

As illustrated in FIG. 5, the relationship between the wavelength and the film thickness can be described using the following Expression (7). In the following Expression (7), n indicates the refractive index of the film, d indicates the film thickness, in indicates the positive integer (1, 2, 3, and so on), and λ indicates the wavelength centroid. 2nd indicates the optical path difference (the optical path difference generated due to the disposed film). The control apparatus 30 estimates a film thickness corresponding to each pixel from the wavelength centroid of each pixel on the basis of the following Expression (7).

$$2nd=m\lambda \ (m=1, 2, 3, \text{and so on}) \ \text{(condition for strengthening)}$$

$$2nd=(m-½)\lambda \ (m=1, 2, 3, \text{and so on}) \ \text{(condition for weakening)} \quad (7)$$

Here, Expression (7) indicating the relationship between the wavelength and the film thickness described above is established when light is perpendicularly incident on the sample 100. On the other hand, when light is not perpendicularly incident on the sample 100, the foregoing Expression (7) is not established. That is, as illustrated in FIG. 6, when light is incident on the sample 100 in which a film 101 is disposed on a surface of a base material 102, an incidence angle of light differs depending on a measurement point so that the optical path difference differs. Therefore, the film thickness cannot be uniformly estimated with high accuracy by the foregoing Expression (7). For this reason, in order to estimate a film thickness with high accuracy at any measurement point (incidence angle), calculation (correction processing) corresponding to the measurement point (incidence angle) is required.

Figure 7:
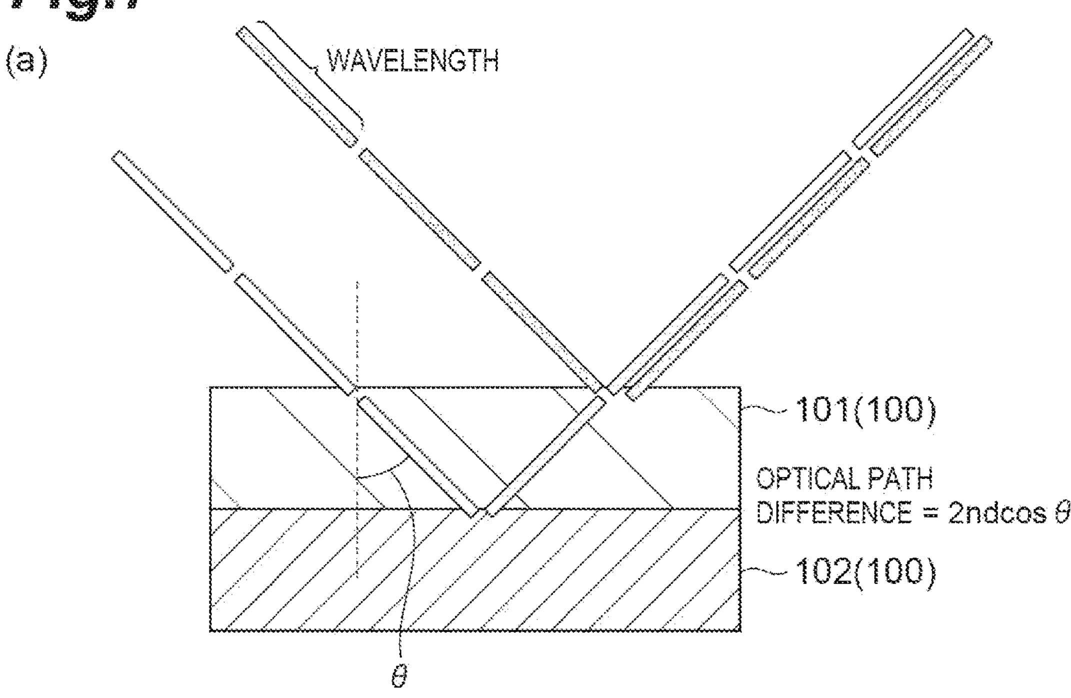
FIG. 7 is an explanatory view of correction of a measurement value of a film thickness.
Figure 7:
Figure 7:
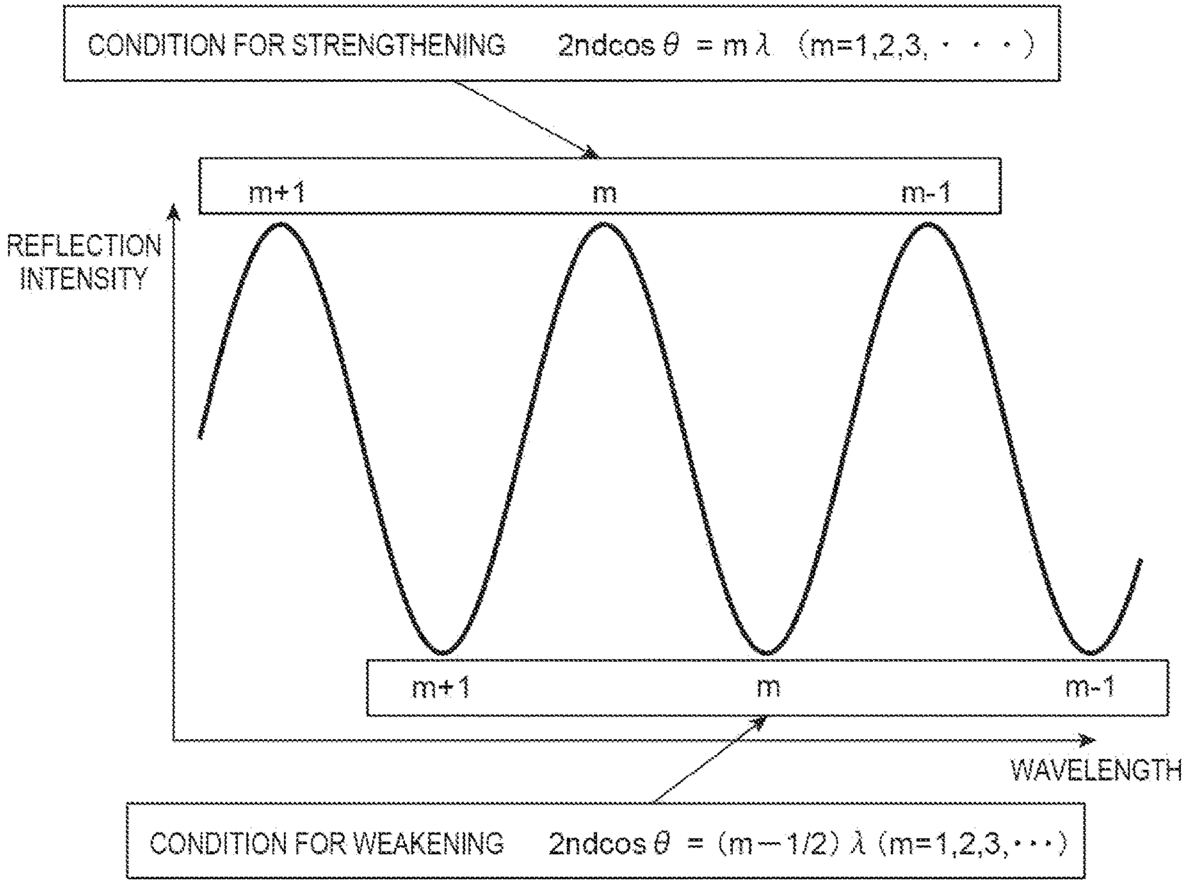

FIG. 7 is an explanatory view of correction of a measurement value of a film thickness. As illustrated in FIG. 7A, when the incidence angle of light is 0, the optical path difference is indicated as 2ndcos θ. Accordingly, the relationship between the wavelength and the film thickness in consideration of the incidence angle θ can be described using the following Expression (8) as illustrated in FIG. 7B.

The control apparatus 30 estimates a film thickness corresponding to the measurement point (incidence angle) on the basis of the following Expression (8). That is, the control apparatus 30 estimates a film thickness in further consideration of a light focusing angle of light reflected by the sample 100 in the lens 21.

$$2nd\cos\theta=m\lambda \text{ (condition for strengthening)}$$

$$2nd\cos\theta=(m-\tfrac{1}{2})\lambda \text{ (condition for weakening)} \quad (8)$$

As described above, the film thickness measuring apparatus 10 performs a film thickness measuring method for measuring a film thickness of the sample 100 during a manufacturing step (here, during dry etching). For example, the film thickness measuring method includes a first step of focusing light (plasma light PL) generated during etching processing and reflected by the one surface of the sample 100; a second step of capturing an image of light separated by the inclined dichroic mirror 22 separating focused light through transmission and reflection; and a third step of deriving a wavelength on the basis of a result of a captured image, estimating the film thickness of the sample 100 on the basis of the wavelength, and obtaining a film thickness distribution on the one surface of the sample 100.

Next, operational effects of the present embodiment will be described.

The film thickness measuring apparatus 10 according to the present embodiment measures a film thickness of the sample 100 during a manufacturing step (here, during dry etching). The film thickness measuring apparatus includes the lens 21 focusing light (plasma light PL) generated in the manufacturing step and reflected by the one surface of the sample 100, the inclined dichroic mirror 22 having a transmissivity and a reflectivity changing in accordance with a wavelength in a predetermined wavelength region and separating light focused by the lens 21 through transmission and reflection, the area sensors 23 and 24 capturing an image of light separated by the inclined dichroic mirror 22, and the control apparatus 30 estimating the film thickness of the sample 100 on the basis of a signal from the area sensors 23 and 24 capturing an image of light and obtaining a film thickness distribution on the one surface of the sample 100. Light reflected by the sample 100 includes light having a wavelength included in the predetermined wavelength region of the inclined dichroic mirror 22.

In the film thickness measuring apparatus 10 according to the present embodiment, light generated in the manufacturing step and reflected by the entire surface or a part of the one surface of the sample 100 is separated by the inclined dichroic mirror 22 having a transmissivity and a reflectivity changing in accordance with a wavelength, an image of separated light is captured by the area sensors 23 and 24, the film thickness of the sample 100 is estimated based on a signal from the area sensors 23 and 24, and the film thickness distribution of at least a part on the one surface of the sample 100 is obtained. In such a film thickness measuring apparatus 10, first, since the film thickness is estimated utilizing light generated in the manufacturing step, there is no need to provide a light source for measuring the film thickness so that the constitution thereof can be simplified. In addition, in this film thickness measuring apparatus 10, since a proportion of transmitted light and a proportion of reflected light in light separated by the inclined dichroic mirror 22 change in accordance with the wavelength, the proportion of transmitted light and the proportion of reflected light can be identified on the basis of the result of a captured image of the area sensors 23 and 24. As a result, the wavelength can be identified. Moreover, in the control apparatus 30, the film thickness of the sample 100 is estimated based on a signal from the area sensors 23 and 24. Although the film thickness can be estimated on the basis of information indicating the wavelength, since the wavelength is identified from the result of a captured image of the area sensors 23 and 24 as described above, the film thickness of the sample 100 can be estimated with high accuracy in consideration of a signal including information of the wavelength (a signal from the area sensors 23 and 24). Since the film thickness of the sample 100 is estimated for each of a plurality of pixels of the area sensors 23 and 24, a distribution of a relative film thickness, a rate of change of the film thickness over time (for example, an etching rate) or an absolute film thickness can be obtained as the film thickness distribution for the one surface of the sample 100. Since such a technique of measuring a film thickness differs from a method for selecting a single or a plurality of wavelengths through filter work or the like, for example, and acquiring light intensity information and accuracy in measuring a film thickness is unlikely to be affected by fluctuation in intensity of light, accuracy in measuring a film thickness can be maintained at a certain level or higher at all times regardless of the fluctuation in intensity of light generated in the manufacturing step. As above, according to the film thickness measuring apparatus 10 according to the present embodiment, the film thickness of the sample 100 during the manufacturing step can be measured with high accuracy.

The control apparatus 30 may estimate the film thickness corresponding to each pixel on the basis of wavelength information for each pixel in the area sensors 23 and 24. According to such a constitution, the film thickness distribution on an irradiation surface of the sample 100 can be estimated more specifically (for each pixel).

The control apparatus 30 may estimate the film thickness in further consideration of the light focusing angle of light reflected by the sample 100 in the lens 21. Since an optical path changes when the light focusing angle in the lens 21 changes, the film thickness may not be able to be estimated with high accuracy from information of only the wavelength. In this regard, in further consideration of the light focusing angle in the lens 21, the film thickness can be estimated with higher accuracy in accordance with an actual optical path.

The foregoing film thickness measuring apparatus 10 may further include the bandpass filters 25 and 26 disposed between the lens 21 and the area sensors 23 and 24. Accordingly, light beyond a desired wavelength range can be removed so that accuracy in estimating a film thickness can be improved.

The semiconductor device manufacturing apparatus 1 according to the present embodiment includes the film forming apparatus 2 for forming a film on the one surface of the sample 100, and the film thickness measuring apparatus 10 described above. According to the semiconductor device manufacturing apparatus 1, a film thickness can be measured while a film is formed on the sample 100 so that accuracy in forming a film thickness can be improved by reflecting the result of measurement of the film thickness in formation of the film thickness.

The lens 21 of the film thickness measuring apparatus 10 is disposed in a manner of facing the one surface of the sample 100 inside the film forming apparatus 2. According to such a constitution, processing of measuring the film thickness can be favorably performed while a film is formed on the sample 100.

The film forming apparatus 2 performs etching of the film on the one surface of the sample 100. According to such a constitution, the film thickness can be measured while etching of the film is performed on the one surface of the sample 100 so that etching accuracy can be improved by reflecting the result of measurement of the film thickness in etching processing.

The film thickness measuring method according to the present embodiment measures a film thickness of the sample 100 during a manufacturing step (here, during dry etching). The film thickness measuring method includes the first step of focusing light generated in the manufacturing step and reflected by at least a part on the one surface of the sample 100; the second step of capturing an image of light separated by the lens 21 having a transmissivity and a reflectivity changing in accordance with a wavelength in a predetermined wavelength region and separating light focused in the first step through transmission and reflection; and the third step of deriving a wavelength on the basis of a result of a captured image in the second step, estimating the film thickness of the sample 100 on the basis of the wavelength, and obtaining a film thickness distribution of at least a part on the one surface of the sample 100. According to the film thickness measuring method according to the present embodiment, accuracy in measuring a film thickness can be maintained at a certain level or higher at all times regardless of the fluctuation in intensity of light generated in the manufacturing step so that the film thickness of the sample 100 during the manufacturing step can be measured with high accuracy.

Hereinabove, the embodiment of the present invention has been described, but the present invention is not limited to the foregoing embodiment. For example, in the film thickness measuring apparatus 10 described above, the distribution of the relative film thickness and the etching rate at a spot corresponding to each pixel are derived. However, in order to obtain the distribution of the absolute film thickness, there is a need to ascertain the film thickness on the one surface of the sample 100 when etching or film formation starts. On the other hand, in the film thickness measuring apparatus 10 described above, a spatial distribution of the relative film thickness at a certain point of time can be obtained. Hence, by detecting spectral information (reference spectral information) at a certain one point (one spot) on the one surface of the sample 100, a distribution of the absolute film thickness can be obtained as the film thickness distribution on the one surface of the sample 100 from the relative film thickness of other parts with respect to the absolute film thickness at the one point on the basis of the relative film thickness distribution and the reference spectral information.

Figure 8:
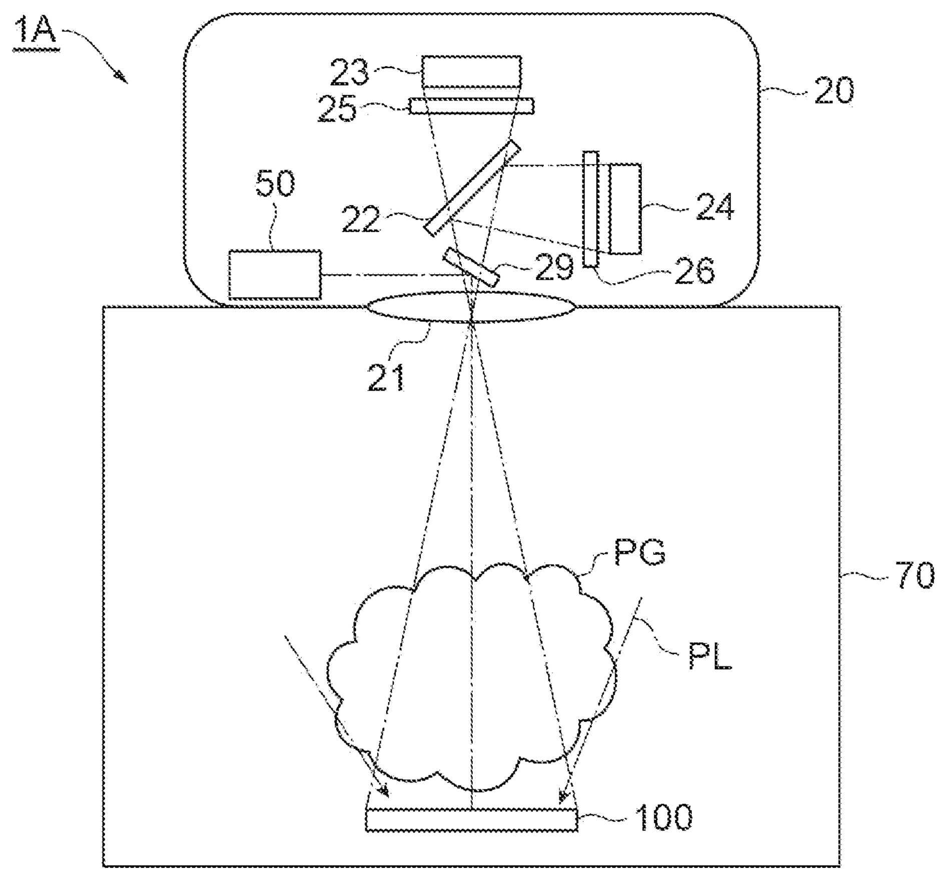
FIG. 8 is a view schematically illustrating a semiconductor device manufacturing apparatus according to a modification example.

FIG. 8 is a view schematically illustrating a semiconductor device manufacturing apparatus 1A according to a modification example. In FIG. 8, illustration of a control apparatus in the semiconductor device manufacturing apparatus 1A is omitted. As illustrated in FIG. 8, the film thickness measuring apparatus of the semiconductor device manufacturing apparatus 1A further includes a half mirror 29 and a spectroscope 50. The constitution thereof is a measurement path for detecting a reference spectrum. For example, the half mirror 29 reflects light (plasma light PL) which has been reflected by one arbitrary point on the one surface of the sample 100 (for example, one point in the vicinity of the center on the one surface of the sample 100), that is, light focused by the lens 21 in a direction of the spectroscope 50. The spectroscope 50 measures an optical spectrum of light (plasma light PL) which has been reflected by one arbitrary point of the sample 100 (for example, one point in the vicinity of the center on the one surface of the sample 100), that is, light reflected by the half mirror 29 in light focused by the lens 21. The spectroscope 50 acquires reference spectral information that is data of the optical spectrum of light at the one point. Further, the control apparatus 30 identifies the absolute value of the film thickness at the one point on the basis of the reference spectral information (optical spectrum) and estimates the absolute value of the film thickness in each region of the sample 100 on the basis of a signal from the area sensors 23 and 24 (that is, information related to deriving of the relative film thickness distribution) and the absolute value of the film thickness at the one point. Such estimation derives not only the amount of change in relative film thickness but also the absolute value of the film thickness in each area by determining the value of in in Expression (7) and Expression (8) and estimating exact interference of the entire image-captured area.

In this manner, since the optical spectrum of light at the one point is measured and the absolute value of the film thickness at the one point is identified, the absolute value can also be estimated with high accuracy for the film thickness in each region other than the one point in the sample 100 on the basis of a distribution of relative values of the film thickness on the one surface of the sample 100 including the one point from a signal from the area sensors 23 and 24 and the absolute value of the film thickness at the one point. Accordingly, not only the amount of change in relative film thickness but also the absolute value of the film thickness in each region of the sample 100 can be estimated with high accuracy. A technique of measuring the absolute value of the film thickness is not limited to that described above, and the absolute value of the film thickness at one point may be identified by known techniques in the related art.

In addition, in the foregoing embodiment, the film thickness measuring apparatus 10 has been described as an apparatus for measuring a film thickness of the sample 100 during etching, but it is not limited to this. The film thickness measuring apparatus may be an apparatus for measuring a film thickness of the sample 100 during film formation. In this case, the film forming apparatus is an apparatus for forming a film on one surface of a semiconductor wafer that is the sample 100. According to such a constitution, the film thickness can be measured while a film is formed on the one surface of the sample 100 so that accuracy in forming a film can be improved by reflecting the result of measurement of the film thickness in processing of film formation.

In addition, in the foregoing embodiment, the control apparatus may estimate the film thickness corresponding to each pixel on the basis of the wavelength information for each pixel in the area sensors 23 and 24. However, a plurality of pixels in the area sensors 23 and 24 may be used as calculation units, and the film thickness distribution may be obtained by estimating the film thickness for each calculation unit with respect to the one surface of the sample 100. According to such a constitution, although a spatial resolution deteriorates, the film thickness distribution on the irradiation surface of the sample 100 can be obtained more specifically and exactly. In addition, in the foregoing embodiment, a plurality of area sensors 23 and 24 are used as image capturing portions. However, a first area and a second area may be provided on a light receiving surface of a single area sensor, an image of light which has been transmitted through the inclined dichroic mirror 22 in the first area may be captured, and an image of light reflected by the inclined dichroic mirror 22 may be captured in the second area. Moreover, the image capturing portion is not limited to the two-dimensional image capturing element and may be a one-dimensional image capturing element such as a linear sensor, or a point image capturing element such as a photodiode.

REFERENCE SIGNS LIST

1, 1A Semiconductor device manufacturing apparatus
2 Film forming apparatus
10 Film thickness measuring apparatus
21 Lens (light focusing element)
22 Inclined dichroic mirror (optical element)
23, 24 Area sensor (image capturing portion)
25, 26 Bandpass filter
30 Control apparatus
50 Spectroscope
100 Sample (object)

The invention claimed is:

1. A film thickness measuring apparatus for measuring a film thickness of an object during a manufacturing step, the film thickness measuring apparatus comprising:
- a light focusing element focusing light generated in the manufacturing step and reflected by at least a part on one surface of the object;
- an optical filter having a transmittance linearly changing in accordance with a wavelength across a predetermined wavelength region, and the optical filter being configured to separate light focused by the light focusing element;
- an image capture capturing an image of light separated by the optical filter; and
- an analyzer estimating the film thickness of the object on the basis of a signal from the image capture capturing an image of light and obtaining a film thickness distribution of at least a part on the one surface of the object,
- wherein light reflected by the object comprises light having a wavelength comprised in the predetermined wavelength region of the optical filter.

2. The film thickness measuring apparatus according to claim 1,
- wherein the image capture is a two-dimensional image capturing element having a plurality of pixels, and
- wherein the analyzer estimates a film thickness corresponding to each pixel on the basis of wavelength information for each of the plurality of pixels in the two-dimensional image capturing element.

3. The film thickness measuring apparatus according to claim 1,
- wherein the analyzer estimates a film thickness in further consideration of a light focusing angle of light reflected by the object in the light focusing element.

4. The film thickness measuring apparatus according to claim 1 further comprising:
- a bandpass filter disposed between the optical filter and the image capture.

5. The film thickness measuring apparatus according to claim 1,
- wherein the film thickness distribution is a distribution of a relative film thickness in at least a part on the one surface of the object.

6. The film thickness measuring apparatus according to claim 1,
- wherein the film thickness distribution is a distribution of a rate of change of the film thickness over time in at least a part on the one surface of the object.

7. The film thickness measuring apparatus according to claim 1,
- wherein the film thickness distribution is a distribution of an absolute film thickness in at least a part on the one surface of the object.

8. The film thickness measuring apparatus according to claim 7 further comprising:
- a spectroscope measuring an optical spectrum of light reflected by one arbitrary point on the one surface of the object in light focused by the light focusing element,
- wherein the analyzer identifies an absolute value of the film thickness at the one point based on the optical spectrum and obtains a distribution of an absolute film thickness in at least a part on the one surface of the object as the film thickness distribution on the basis of a signal from the image capture and the absolute value of the film thickness at the one point.

9. A semiconductor device manufacturing apparatus comprising:
- a film forming apparatus for forming a film on one surface of an object; and
- the film thickness measuring apparatus according to claim 1.

10. The semiconductor device manufacturing apparatus according to claim 9,
- wherein the light focusing element of the film thickness measuring apparatus is disposed in a manner of facing the one surface of the object inside the film forming apparatus.

11. The semiconductor device manufacturing apparatus according to claim 9,
- wherein the film forming apparatus performs etching of the film on the one surface of the object.

12. The semiconductor device manufacturing apparatus according to claim 9,
- wherein the film forming apparatus forms a film on the one surface of the object.

13. A film thickness measuring method for measuring a film thickness of an object during a manufacturing step, the film thickness measuring method comprising:
- a first step of focusing light generated in the manufacturing step and reflected by at least a part on one surface of the object;
- a second step of capturing an image of light separated by an optical filter having a transmittance linearly changing in accordance with a wavelength across a predetermined wavelength region, and the optical filter being configured to separate light focused in the first step; and
- a third step of deriving a wavelength on the basis of a result of a captured image in the second step, estimating the film thickness of the object on the basis of the wavelength, and obtaining a film thickness distribution of at least a part on the one surface of the object,
- wherein light reflected by the object comprises light having a wavelength comprised in the predetermined wavelength region of the optical filter.

14. The film thickness measuring method according to claim 13 further comprising:
- a fourth step of measuring an optical spectrum of light reflected by one arbitrary point on the one surface of the object in light focused in the first step,
- wherein in the third step, an absolute value of the film thickness at the one point is identified based on the optical spectrum, and a distribution of an absolute film thickness in at least a part on the one surface of the object is obtained as the film thickness distribution on the basis of the result of a captured image and the absolute value of the film thickness at the one point.

* * * * *